United States Patent
Sohn et al.

(10) Patent No.: US 7,629,613 B2
(45) Date of Patent: Dec. 8, 2009

(54) DISPLAY DEVICE AND METHOD OF MANUFACTURING THE SAME

(75) Inventors: Woo-Sung Sohn, Seoul (KR); Min-Wook Park, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 207 days.

(21) Appl. No.: 11/223,338

(22) Filed: Sep. 9, 2005

(65) Prior Publication Data

US 2006/0049408 A1 Mar. 9, 2006

(30) Foreign Application Priority Data

Sep. 9, 2004 (KR) ...................... 10-2004-0072304

(51) Int. Cl.
*H01L 29/04* (2006.01)
(52) U.S. Cl. .................. 257/72; 257/797; 257/E23.179
(58) Field of Classification Search ................... 257/72, 257/797
See application file for complete search history.

(56) References Cited

U.S. PATENT DOCUMENTS 6,424,052 B1 * 7/2002 Miyamoto et al. .......... 257/797

2003/0013318 A1 * 1/2003 Shiraishi et al. ............. 438/758

FOREIGN PATENT DOCUMENTS

| JP | 08146371 | | 6/1996 |
| JP | 08146400 | | 6/1996 |
| JP | 411239952 | * | 9/1999 |
| JP | 2000-275663 A | | 10/2000 |
| JP | 2002-303859 A | | 10/2002 |

OTHER PUBLICATIONS

Chinese Office Action; Nov. 30, 2007; 200510099185.7.

* cited by examiner

*Primary Examiner*—Long Pham
(74) *Attorney, Agent, or Firm*—Cantor Colburn LLP

(57) ABSTRACT

A display device includes first and second substrates, and first and second alignment keys. The first and second substrates have first and second display regions and first and second peripheral regions, respectively. The first alignment key is disposed in the first peripheral region of the first substrate. The first alignment key includes a first pattern and a second pattern. The second alignment key is disposed in the second peripheral region of the second substrate such that the second alignment key faces the first alignment key. As a result, first alignment key may be formed through a procedure of forming the pixel electrode. Therefore, there exists no deviation between the first alignment key and the pixel electrode and the first alignment key may be easily detected because of the first pattern that is opaque, so that misalignment is prevented.

22 Claims, 11 Drawing Sheets

FIG. 7E
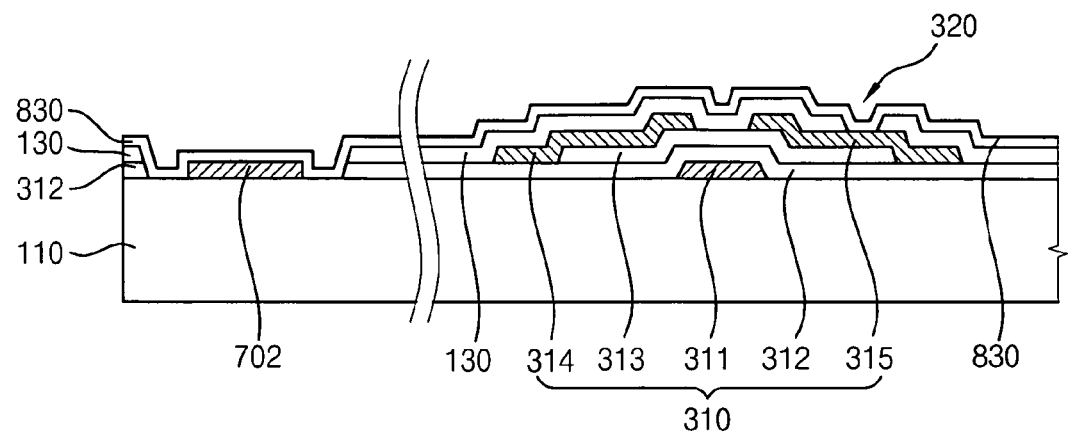
FIG. 7F
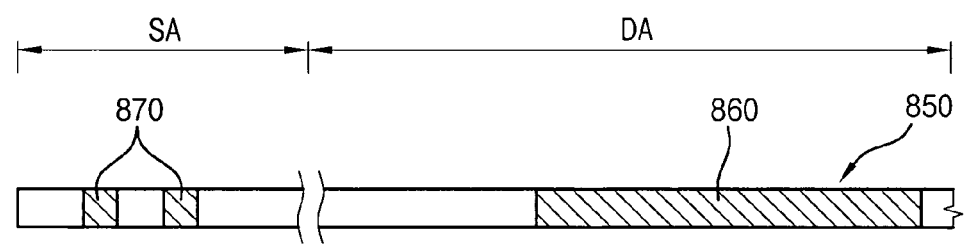
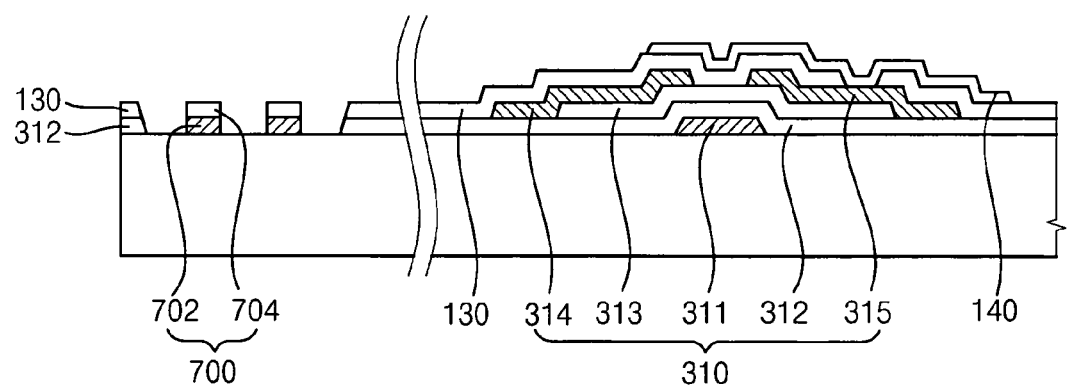

DISPLAY DEVICE AND METHOD OF MANUFACTURING THE SAME

This application claims priority to Korean Patent Application No; 2004-72304, filed on Sep. 9, 2004 and all the benefits accruing therefrom under 35 U.S.C. §119, and the contents of which in its entirety are herein incorporated by reference.

BACKGROUND OF THE INVENTION

1. Field of the Invention

The present invention relates to a display device and a method of manufacturing the display device. More particularly, the present invention relates to a display device capable of enhancing a display quality, and a method of manufacturing the display device, which enhances alignment accuracy between a lower substrate and an upper substrate of the display device.

2. Description of the Related Art

A liquid crystal display (LCD) device includes an LCD panel and a backlight assembly. The LCD panel includes a thin film transistor (TFT) substrate, a color filter substrate and a liquid crystal layer. The TFT substrate and the color filter substrate face each other. The liquid crystal layer is disposed between the TFT substrate and the color filter substrate. When electric fields are applied to the liquid crystal layer, an arrangement of liquid crystal molecules of the liquid crystal layer is altered to change optical transmissivity, thereby images are displayed on the LCD panel. The backlight assembly provides the LCD panel with light.

The TFT substrate includes a thin film transistor and a pixel electrode. The color filter substrate includes a black matrix, a color filter and a common electrode facing the pixel electrode of the TFT substrate.

The TFT substrate and the color filter substrate include a first alignment key and a second alignment key, respectively, for aligning the TFT substrate and the color filter substrate when the TFT substrate and the color filter substrate are assembled. The first alignment key of the TFT substrate is formed through a manufacturing process of a gate electrode of the TFT, or a manufacturing process of source and drain electrodes of the TFT. The second alignment key of the color filter substrate is formed through a manufacturing process of the black matrix.

After the first and second alignment keys are formed, many layers may be formed over the first and second alignment keys. During forming the layers, misalignment may occur. When accurate aligning is performed, a color filter of the color filter layer faces a pixel electrode of the TFT substrate. Many layers are formed and patterned over the first alignment key in order to form the pixel electrode after the first alignment key is formed, which may cause the pixel electrode to be misaligned with respect to the first alignment key. Therefore, when the TFT substrate and the color filter substrate are assembled by using the first and second alignment keys, the pixel electrode of the TFT substrate may deviate from the color filter of the color filter substrate.

In order to reduce misalignment of the TFT substrate and the color filter substrate, the first and second alignment keys are formed through a process of forming the pixel electrode of the TFT substrate and the common electrode of the color filter substrate, respectively. Then, the first and second alignment keys are formed through an optically transparent and electrically conductive material such as indium tin oxide (ITO), indium zinc oxide (IZO), etc. When the first and second alignment keys are formed through the optically transparent and electrically conductive material, the first and second alignment keys are transparent, so that an apparatus for detecting the first and second alignment keys cannot detect the first and second alignment keys.

BRIEF SUMMARY OF THE INVENTION

The present invention provides a display device having alignment keys for accurate aligning between a TFT substrate and a color filter substrate.

The present invention also provides a method of manufacturing the above-mentioned display device.

In an exemplary embodiment of a display device, the display device includes a first substrate, a second substrate, a first alignment key and a second alignment key. The first substrate has a first display region and a first peripheral region surrounding the first display region. The second substrate faces the first substrate. The second substrate has a second display region facing the first display region and a second peripheral region facing the first peripheral region. The first alignment key is disposed in the first peripheral region of the first substrate. The first alignment key includes a first metal pattern and a second metal pattern. The second alignment key is disposed in the second peripheral region of the second substrate such that the second alignment key faces the first alignment key.

In another exemplary embodiment the display device includes a display panel and an alignment key part. The display panel includes a first substrate and a second substrate facing the first substrate. The display panel has a display region and a peripheral region surrounding the display region. The alignment key part for aligning the first substrate and the second substrate is disposed in the peripheral region. The alignment key part includes a first pattern that is opaque and a second pattern that is transparent.

In an exemplary method of manufacturing a display device, a first pattern is formed on a first substrate including a display region and a peripheral region surrounding the display region. The first pattern is disposed in the peripheral region. A second pattern is formed over the first pattern. The first and second patterns are etched simultaneously to form an alignment key. The first and second substrates are aligned by using the alignment key.

In another exemplary method of manufacturing a display device includes forming a first substrate having a first display region and a first peripheral region surrounding the first display region. The first substrate includes a first alignment key formed in the first peripheral region. The first alignment key has a first pattern that is opaque and a second pattern that is transparent. A second substrate having a second display region and a second peripheral region surrounding the second display region is formed. The second substrate includes a second alignment key formed in the second peripheral region. The second alignment key has a third pattern that is opaque and a fourth pattern that is transparent. The first and second substrates are aligned using the first and second alignment keys such that the first display region and the first peripheral region face the second display region and the second peripheral region, respectively.

According to the above-described embodiments, the first alignment key may be formed through a procedure of forming the pixel electrode. Therefore, there exists no deviation between the first alignment key and the pixel electrode and the first alignment key may be easily detected because the first metal layer pattern that is opaque, so that misalignment is prevented.

BRIEF DESCRIPTION OF THE DRAWINGS

The above and other features and advantages of the present invention will become more apparent by describing in detailed exemplary embodiments thereof with reference to the accompanying drawings, in which:

FIGS. 7A through 7F are cross-sectional views illustrating a process of manufacturing the TFT substrate in FIG. 1.

DETAILED DESCRIPTION OF THE INVENTION

Figure 1:
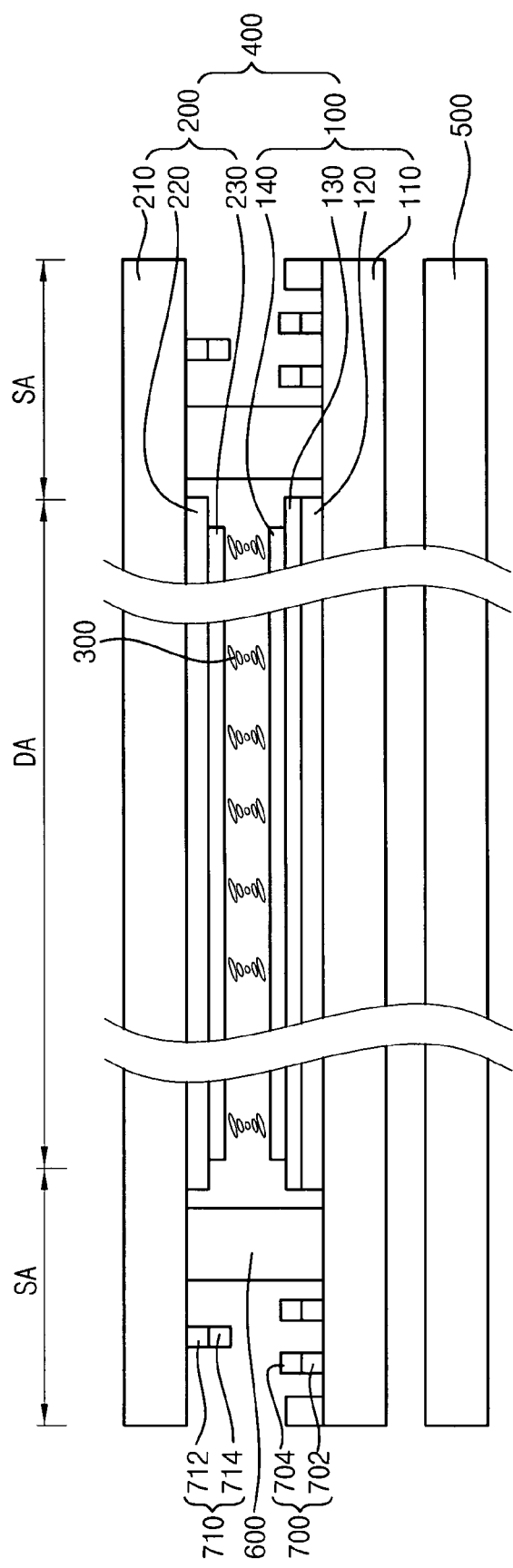
FIG. 1 is a cross-sectional view illustrating an exemplary embodiment of a liquid crystal display device according to the present invention.

It should be understood that the exemplary embodiments of the present invention described below may be varied and modified in many different ways without departing from the inventive principles disclosed herein, and the scope of the present invention is therefore not limited to these particular flowing embodiments. Rather, these embodiments are provided so that this disclosure will be thorough and complete, and will fully convey the concept of the invention to those skilled in the art by way of example and not of limitation.

Hereinafter, the embodiments of the present invention will be described in detail with reference to the accompanied drawings. In the drawings, the thickness of the layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

FIG. 1 is a cross-sectional view illustrating an exemplary embodiment of a liquid crystal display device according to the present invention.

Referring to FIG. 1, a liquid crystal display (LCD) device includes an LCD panel 400 and a backlight assembly 500. The LCD panel 400 includes a thin film transistor (TFT) substrate 100, a color filter substrate 200, and a liquid crystal layer 300 disposed between the TFT substrate 100 and the color filter substrate 200. The backlight assembly 500 provides the LCD panel 400 with light.

The LCD panel 400 includes a display region DA for displaying images and a peripheral region SA surrounding the display region DA.

The TFT substrate 100 includes a first transparent substrate 110, a TFT layer 120, a protection layer 130 and a pixel electrode 140. The TFT layer 120 is formed on the first transparent substrate 110, and includes a plurality of TFTs arranged in a matrix. The protection layer 130 is formed on the TFT layer 120. The pixel electrode 140 is formed on the protection layer 130 and electrically connected to the TFT layer 120.

Each of the TFTs of the TFT layer 120 includes a gate electrode, a source electrode and a drain electrode. The drain electrode is electrically connected to the pixel electrode 140. The gate electrode, the source electrode and the drain electrode are formed from a metal layer. In a particular exemplary embodiment, the metal layer may include chromium (Cr).

The color filter substrate 200 includes a second transparent substrate 210, a color filter layer 220 formed on the second transparent substrate 210, and a common electrode 230 formed on the color filter layer 220. The color filter layer 220 includes a red color filter, a green color filter and a blue color filter. The color filter substrate 200 further includes a black matrix (referring to FIG. 5). The black matrix prevents light from leaking between the red color filter, the green color filter and the blue color filter. In an exemplary embodiment, the black matrix may be formed through an inorganic layer including, but not limited to, chromium (Cr), chromium oxide, etc. Additionally, when the black matrix is formed with the inorganic layer, a leveling layer for leveling the color filter layer 220 is not required.

The TFT substrate 100 and the color filter substrate 200 are combined with each other through a combining member 600 disposed at the peripheral region SA. The combining member 600 may be a seal line that is designed to prevent the liquid crystal layer 300 from leaking from the display region DA into the surrounding peripheral region SA.

The combining member 600 has a predetermined height, so that when the TFT substrate 100 and the color filter substrate 200 are combined with each other, a cell gap is created between the TFT substrate 100 and the color filter substrate 200. The liquid crystal layer 300 is disposed in the cell gap.

The TFT substrate 100 includes a first alignment key 700. The first alignment key 700 is disposed in the peripheral region SA. The color filter substrate 200 includes a second alignment key 710 corresponding to the first alignment key 700. The second alignment key 710 is also disposed in the peripheral region SA.

In an exemplary embodiment, the first alignment key 700 includes a first metal layer pattern 702 and a first transparent layer pattern 704 which is formed on the first metal layer pattern 702. The first metal layer pattern 702 is formed with a metal layer that is also used for forming the gate electrode, or the source and drain electrodes. The first transparent layer pattern 704 is formed with a transparent layer that is also used for forming the pixel electrode 140.

The gate, drain and source electrodes of the TFT may be constructed of chromium (Cr), and the pixel electrode may be constructed of indium tin oxide (ITO). The first metal layer pattern 702 and the first transparent layer pattern 704 may be patterned simultaneously or sequentially. An etchant that is capable of etching both chromium and ITO may be used when the first alignment key 700 is formed.

The second alignment key 710 includes a second metal layer pattern 712 and a second transparent layer pattern 714 formed on the second metal layer pattern 712. The second metal layer pattern 712 is formed with a metal layer that is also used for forming the black matrix. The second transparent layer pattern 714 is formed with a transparent layer that is also used for forming the common electrode 230.

In an exemplary embodiment, the black matrix may be constructed of chromium (Cr), and the common electrode 230 may be constructed of indium tin oxide (ITO). The second metal layer pattern 712 and the second transparent layer pattern 714 may be patterned simultaneously or sequentially. An etchant that is capable of etching both chromium and ITO may be used when the second alignment key 710 is formed.

Figure 2:
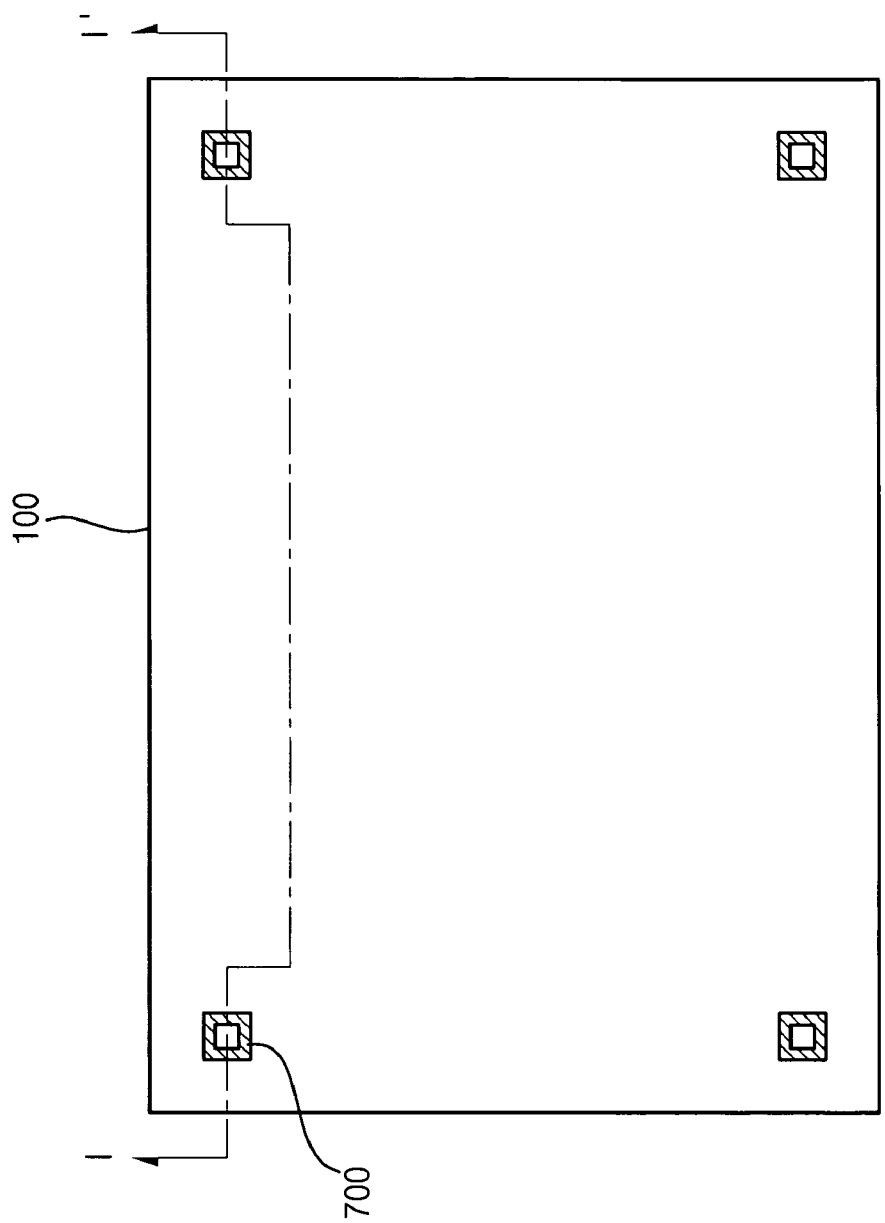
FIG. 2 is a plan view illustrating an exemplary embodiment of a first alignment key formed on a TFT substrate in FIG. 1.
Figure 3:
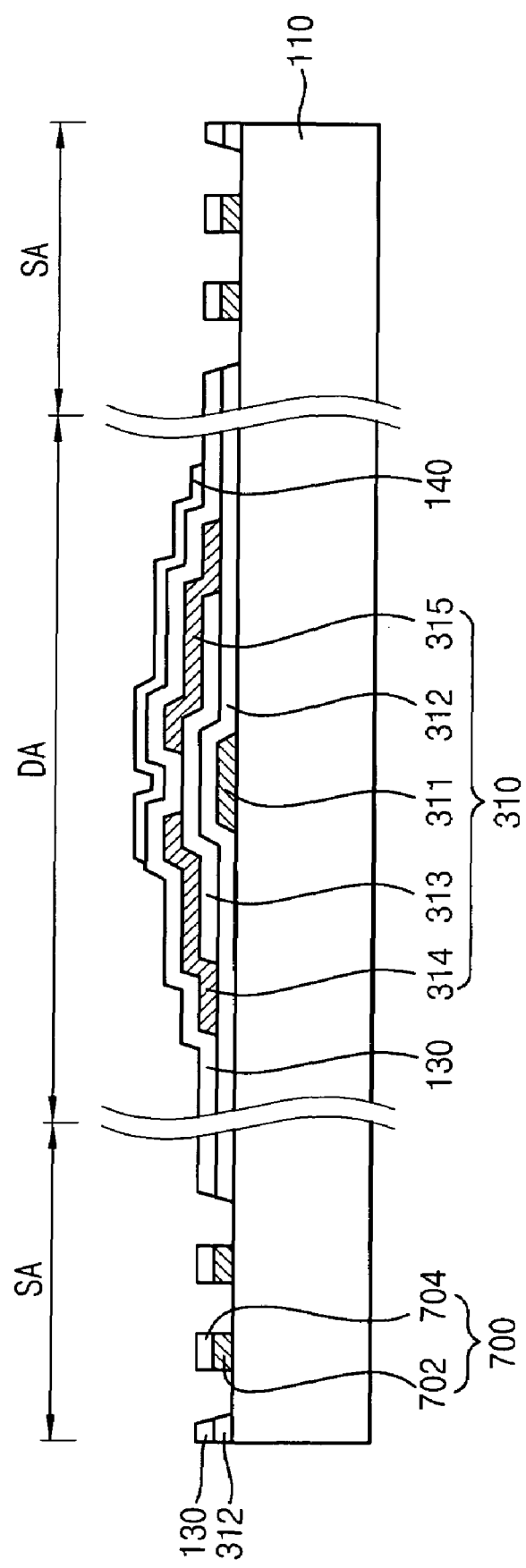
FIG. 3 is a cross-sectional view taken along line I-I' in FIG. 2.

FIG. 2 is a plan view illustrating an exemplary embodiment of a first alignment key formed on a TFT substrate in FIG. 1, and FIG. 3 is a cross-sectional view taken along line I-I' in FIG. 2.

Referring to FIGS. 2 and 3, the first alignment key 700 is disposed at a corner of the TFT substrate 100. In the exemplary embodiment shown, four first alignment keys 700 are disposed at four corners, respectively, of the TFT substrate 100. It is also contemplated that one or more alignment keys 700 may disposed in various locations on the TFT substrate. The first alignment key 700 may be constructed to have a frame shape, such as a rectangle or square having a concentric rectangular or square opening. Likewise, the first alignment key 700 may be constructed to have any other suitable shape.

The TFT 310 is formed in the display region DA of the TFT substrate 100. The TFT 310 includes a gate electrode 311, a gate insulation layer 312, an active layer 313, a source electrode 314 and a drain electrode 315. The electrodes 311, 314, 315 and the layers 312, 313 may be formed in sequence.

The protection layer 130 is formed on the TFT 310, and the pixel electrode 140, which may be constructed of ITO, is formed on the protection layer 130. The gate insulation layer 312, the protection layer 130 and the pixel electrode 140 are formed to cover both the display region DA and the peripheral region SA. A portion of the gate insulation layer 312 and the protection layer 130, which is disposed at the peripheral region SA, is removed during a procedure of forming an electrode pad (not shown). The pixel electrode 140 is electrically connected to the drain electrode 315 of the TFT 310 through a contact hole (not shown).

In an exemplary embodiment, a chromium layer for forming the gate electrode 311 or the source and drain electrodes 314 and 315, is patterned to have a rectangular shape to form a first metal layer pattern 702 in the peripheral region SA. The chromium layer may be patterned to form the gate electrode 311 or the source and drain electrodes 314 and 315 simultaneously with the forming of the first metal layer pattern 702. Alternatively, The chromium layer may be patterned to form the gate electrode 311 or the source and drain electrodes 314 and 315 before or after the first metal layer pattern 702 is formed.

For example, an ITO layer may be formed on both the display region DA and the peripheral region SA, and the ITO layer may be patterned to form the pixel electrode 140 in the display region DA and to form the first alignment pattern 700 in the peripheral region SA. The first alignment key 700 in the peripheral region SA includes the first metal layer pattern 702 and a first transparent layer pattern 704. The first metal layer pattern 702 has a rectangular shape and is patterned together with the first transparent layer pattern 704 to form the first alignment key 700. The first metal layer pattern 702 and the first transparent layer pattern 704 may form a frame shaped first alignment key 700.

In an exemplary embodiment, the first alignment key 700 is formed through a procedure of forming the pixel electrode 140. Therefore, there exists no deviation between the first alignment key 700 and the pixel electrode 140. Additionally, the first alignment key 700 may be easily detected because the first metal layer pattern 702 is opaque.

Figure 4:
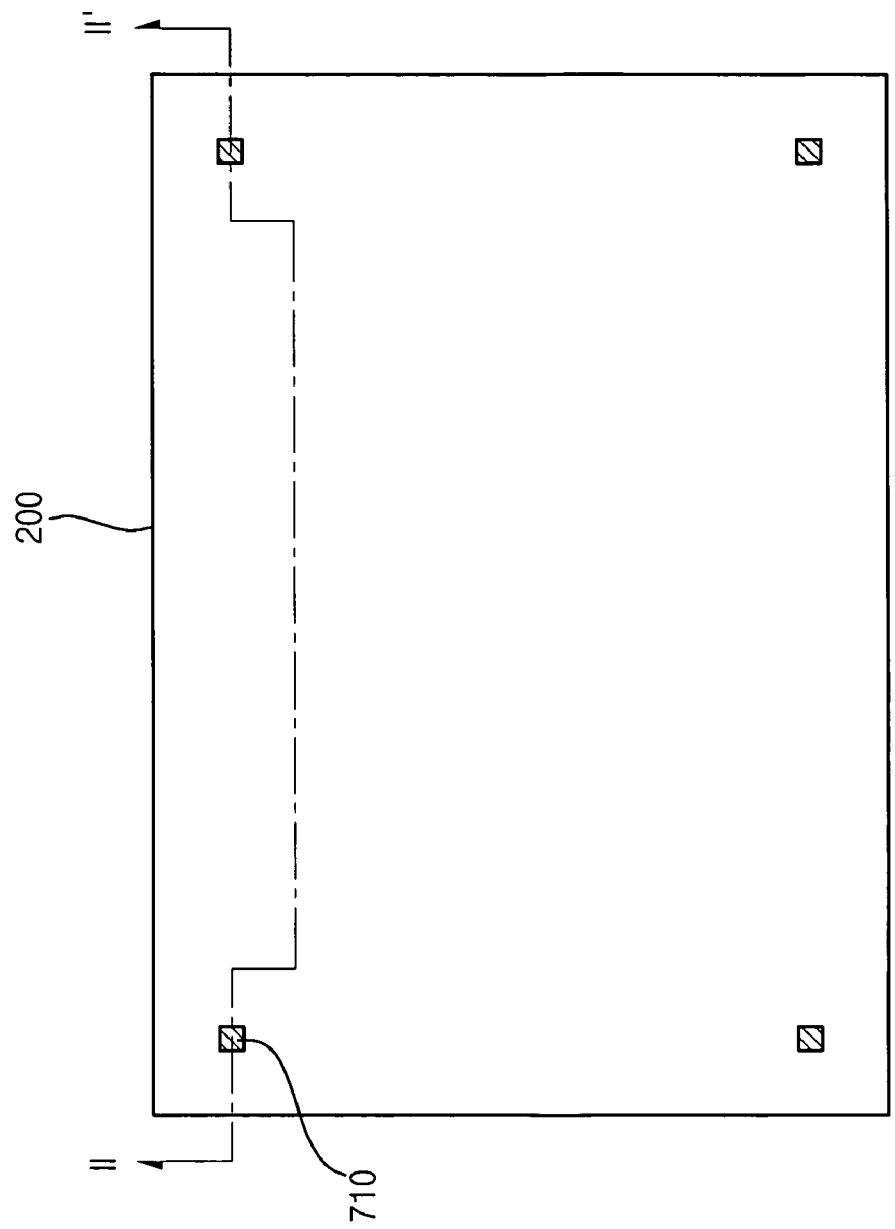
FIG. 4 is a plan view illustrating an exemplary embodiment of a second alignment key formed on a color filter substrate in FIG. 1.
Figure 5:
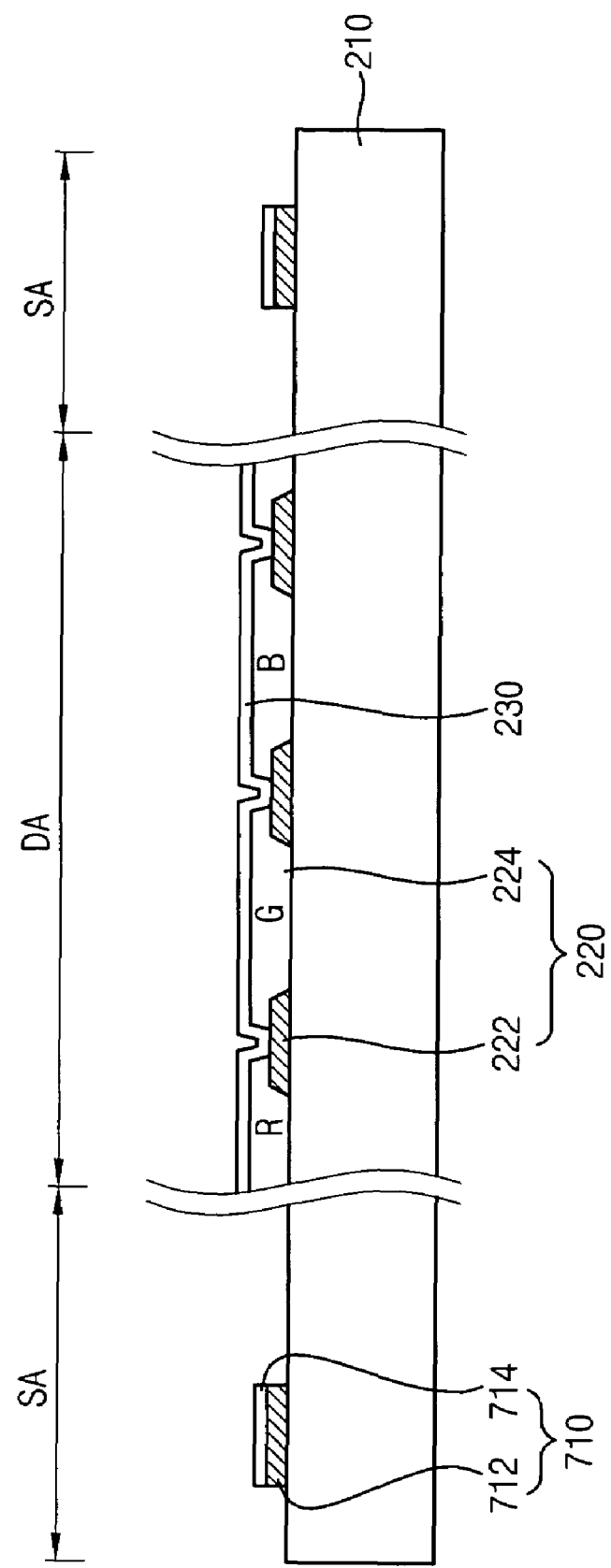
FIG. 5 is a cross-sectional view taken along line II-II' in FIG. 4.

FIG. 4 is a plan view illustrating an exemplary embodiment of a second alignment key formed on a color filter substrate in FIG. 1, and FIG. 5 is a cross-sectional view taken along line II-II' in FIG. 4.

Referring to FIGS. 4 and 5, each second alignment key 710 is formed at a corner of the color filter substrate 200. In an exemplary embodiment, four second alignment keys 710 are formed at four corners of the color filter substrate 200. It is also contemplated that one or more second alignment keys 710 may be disposed in various arrangements on the color filter substrate 200. The second alignment key 710 has a rectangular or square shape that is smaller than the concentric rectangular opening of the first alignment key 700. Additionally the second alignment key 710 may be any other suitable shape.

A color filter layer 220 is formed on the display region DA of the second transparent substrate 210. The color filter layer 220 includes the black matrix 222 formed on the second transparent substrate 210 and the color filter 224 formed between the black matrixes 222. The color filter 224 includes a red color pixel 'R', a green color pixel 'G' and a blue color pixel 'B'. The black matrix 222 may be constructed of chromium (Cr) and chromium oxide.

The common electrode 230 may be constructed of any suitable optically transparent and electrically conductive material including, but not limited to, indium tin oxide (ITO), indium zinc oxide (IZO), etc. The common electrode is formed on the color filter 224.

The second alignment key 710 is formed in the peripheral region SA using a similar procedure used to form the black matrix 222, so that the second alignment key includes chromium (Cr) like the black matrix 222. Additionally, for example, an ITO layer may be formed on both the display region DA and the peripheral region SA, and the ITO layer may be patterned to form both the common electrode 230 in the display region DA and the second alignment pattern 710 in the peripheral region SA. Chromium, or any other suitable material, is patterned to form the second alignment key 710 in the peripheral region SA. The second alignment key 710 includes the second metal layer pattern 712 and the second transparent layer pattern 714.

In an alternative exemplary embodiment, the second alignment key 710 may be patterned through a procedure of forming the black matrix 222. The black matrix 222 may be used to determine a position of the color filter 224. The TFT substrate 100 and the color filter substrate 200 are aligned such that the color filter 224 of the color filter substrate 200 faces the pixel electrode. For example, the second alignment key 710 is advantageously patterned during formation of the black matrix 222.

Figure 6:
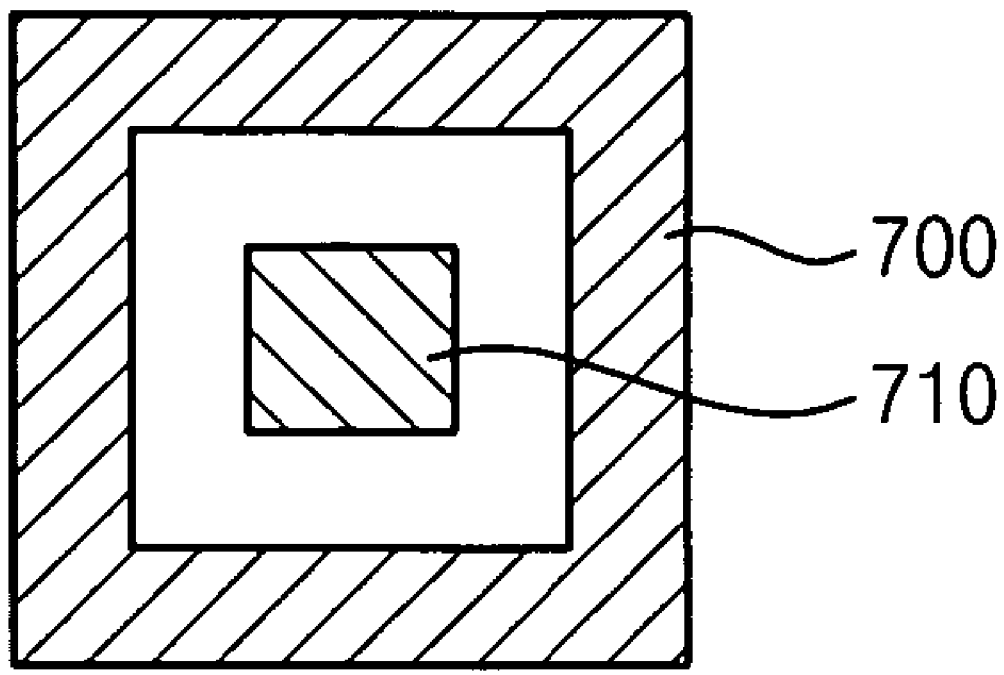
FIG. 6 is a plan view illustrating the first alignment key in FIG. 2 and the second alignment key in FIG. 4 aligned together.

FIG. 6 is a plan view illustrating the first alignment key in FIG. 2 and the second alignment key in FIG. 4 aligned together.

Referring to FIG. 6, the first alignment key 700 has a frame shape having a concentric rectangular opening, and the second alignment key 710 has a rectangular shape that is smaller than the concentric rectangular opening. The TFT substrate 100 and the color filter substrate 200 are aligned such that the second alignment key 710 is disposed at a center portion of the first alignment key 700.

In an exemplary embodiment, the first alignment key 700 has, for example, a frame shape, and the second alignment key 710 has, for example, a rectangular shape. However, it is contemplated that the first and second alignment keys 700 and 710 may have various shapes including, but not limited to, circular or triangular.

Hereinafter, an exemplary method of forming the first and second alignment keys will be discussed in further detail.

FIGS. 7A through 7F are cross-sectional views illustrating a process of manufacturing the TFT substrate in FIG. 1.

Figure 7A:
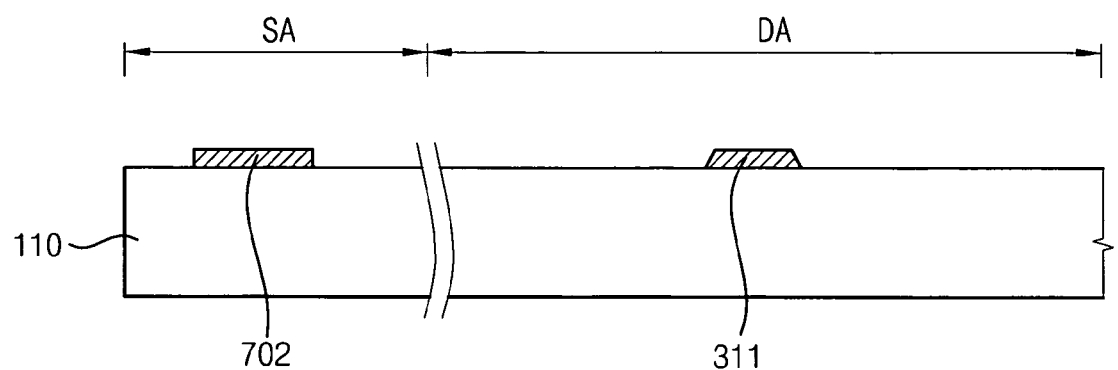

Referring to FIG. 7A, a first metal layer (not shown) is formed on the first transparent substrate 110 by, for example, a sputtering method, and the first metal layer is patterned to form the gate electrode 311 in the display region DA and the first metal layer pattern 702 in the peripheral region SA. Alternatively, the first metal layer pattern 702 may be formed through a procedure of forming the source and drain electrodes 314 and 315 which is explained in more detail herein.

Figure 7B:
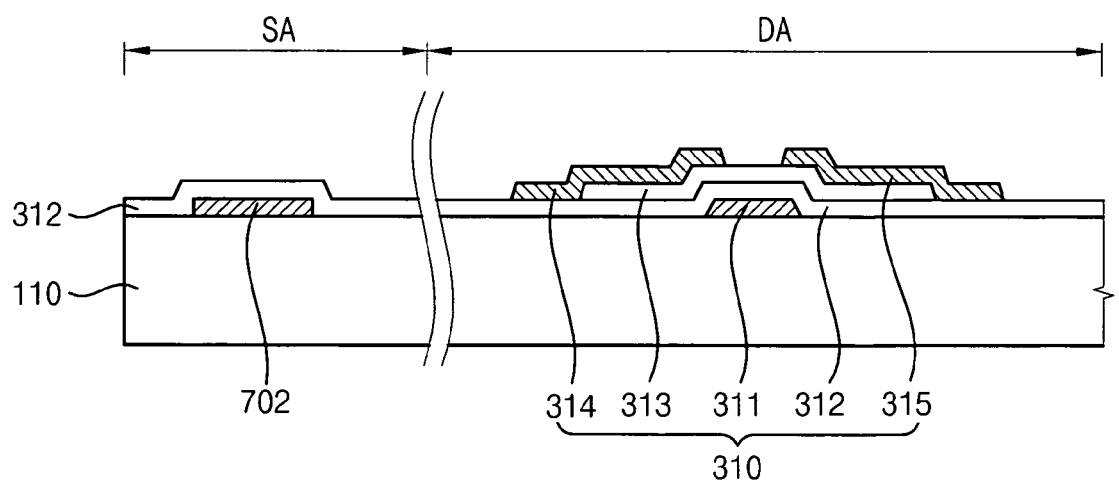

Referring to FIG. 7B, a silicon nitride (SiNx) layer is formed on the first transparent substrate 110 having the gate electrode 311 and the first metal layer pattern 702 to form the gate insulation layer 312. Then, an amorphous silicon (a-Si) layer is formed on the gate insulation layer 312, and n+ a-Si layer is formed on the a-Si layer. The a-Si layer and the n+ a-Si layer are patterned to form the active layer 313.

A second metal layer (not shown) is formed on the first transparent substrate 110 having the active layer 313 formed thereon by, for example, a sputtering method, and the second metal layer is patterned to form the source and drain electrodes 314 and 315 on the active layer 313 in the display region DA. This concludes formation of the TFT 310.

Figure 7C:
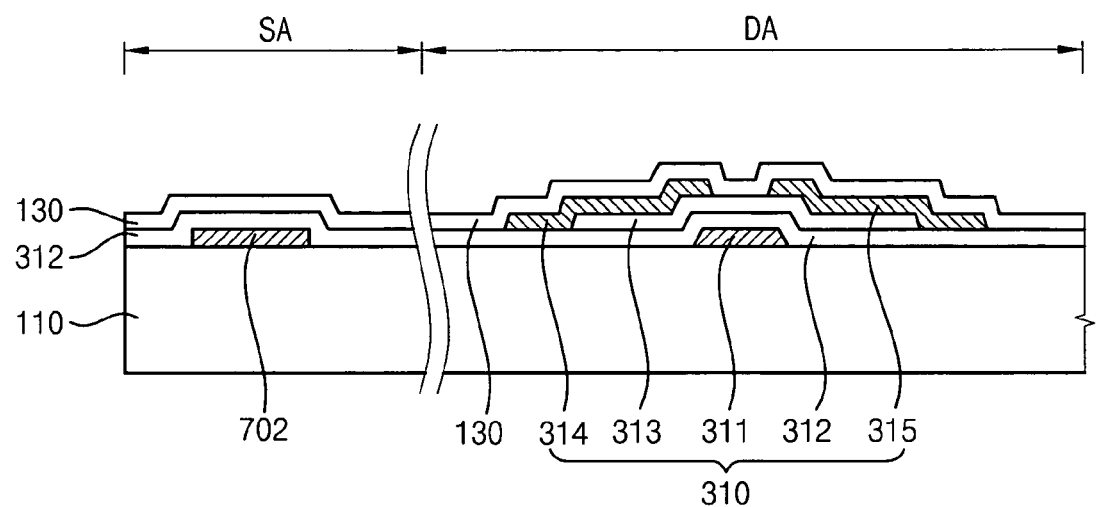

Referring to FIG. 7C, an inorganic layer, such as silicon nitride layer, is formed on the first transparent substrate (not shown) having the TFT 310 formed thereon by, for example, a spin coating method, a chemical vapor deposition (CVD) method, etc. to form the protection layer 130. The protection layer 130 is formed in both the display region DA and the peripheral region SA.

Figure 7D:
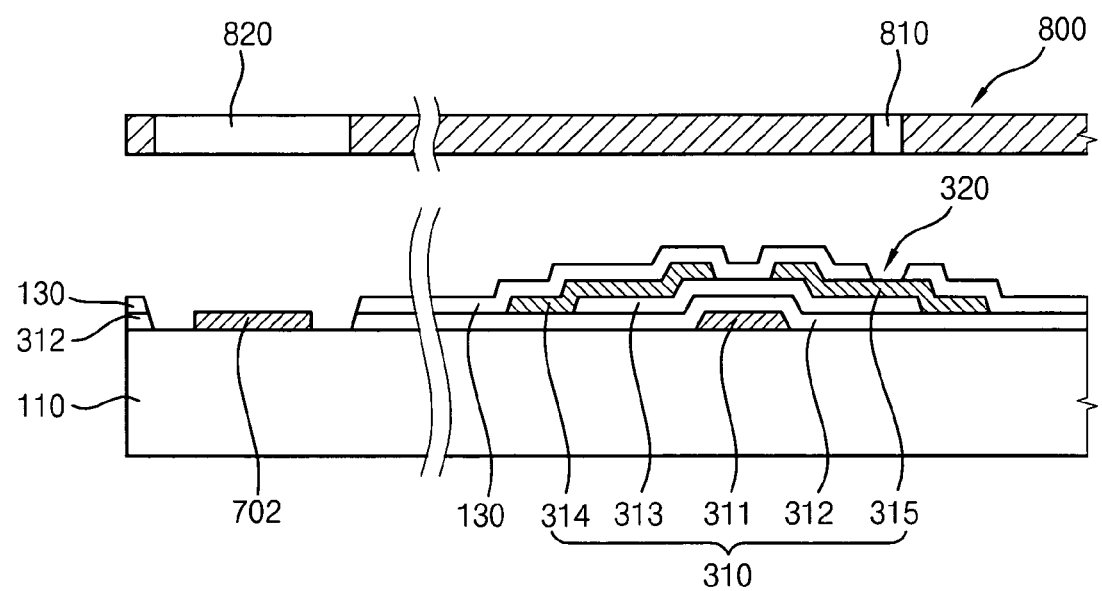

Referring to FIG. 7D, a first mask 800 having patterns is disposed over the protection layer 130. The first mask 800 includes a first opening portion 810 for exposing a portion of the drain electrode 315, and a second opening portion 820 for exposing a region where the first metal layer pattern 702 is formed.

The protection layer 130 is exposed and developed and a contact hole 320 corresponding to the first opening 810 is formed. Next, a portion of the gate insulation layer 312 and the protection layer 130, which corresponds to the second opening 820, is removed to expose the first metal layer pattern 702 and a portion of the first transparent substrate 110.

Referring to FIG. 7E, a transparent layer 830 which may be constructed of ITO is formed on the first transparent substrate 110 having the protection layer 130 formed thereon. The transparent layer 830 covers both the display region DA and the peripheral region SA.

Referring to FIG. 7F, a second mask 850 having patterns is disposed over the transparent layer 830. The second mask 850 includes a first blocking portion 860 for forming a pixel electrode 140, and a second blocking portion 870 for forming the first alignment key 700.

Then, the transparent layer 830 is exposed and developed to form the pixel electrode 140 that is electrically connected to the drain electrode through the contact hole 320 in the display region DA, and the first alignment key 700. When the transparent layer 830 is etched, the first metal layer pattern 702 including chromium (Cr) may also be etched to form the first alignment key 700.

FIGS. 8A through 8D are cross-sectional views illustrating a process of manufacturing the color filter substrate in FIG. 1.

Figure 8A:
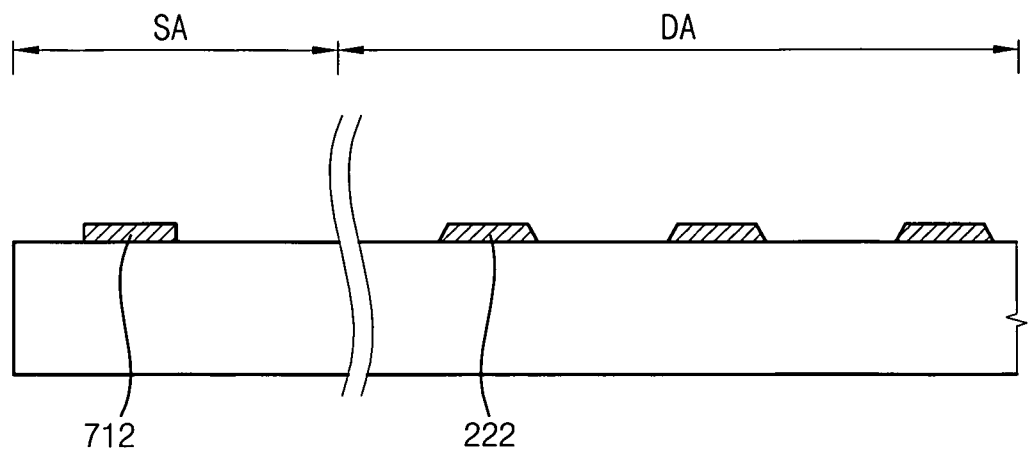
FIGS. 8A through 8D are cross-sectional views illustrating a process of manufacturing the color filter substrate in FIG. 1.

Referring to FIG. 8A, a third metal layer (not shown) including, for example, chromium (Cr) or chromium oxide is formed on the second transparent substrate 210 by, for example, a sputtering method, and then the third metal layer is patterned to form the black matrix 222 in the display region DA and the second metal layer pattern 712 in the peripheral region SA.

Figure 8B:
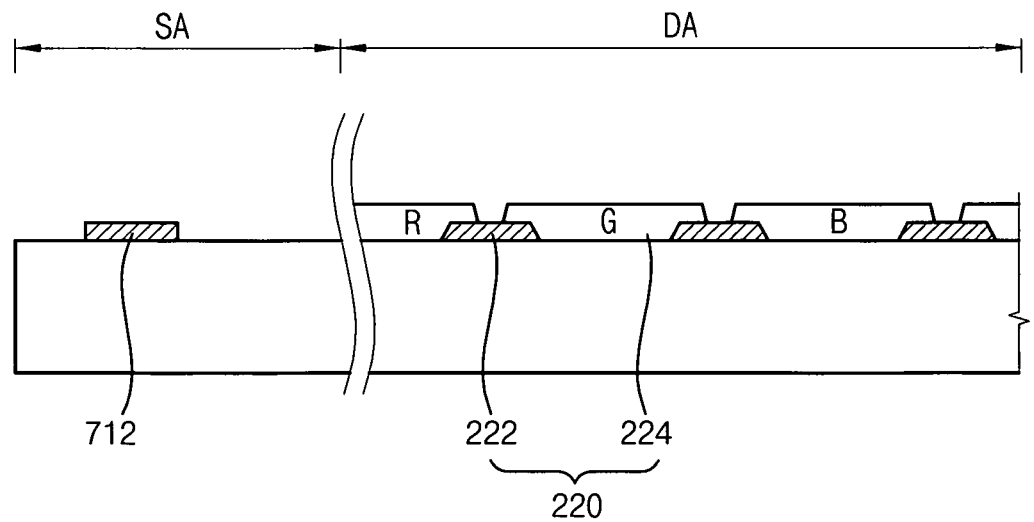

Referring to FIG. 8B, a photoresist including a red colored pigment or red colored dye is formed on the second transparent substrate 210 having the black matrix 222 formed thereon, and then the photoresist is patterned to form the red pixel 'R' of the color filter 224. A photoresist including a green colored pigment or green colored dye is formed on the second transparent substrate 210 having the red pixel 'R' formed thereon, and then the photoresist is patterned to form the green pixel 'G' of the color filter 224. A photoresist including a blue colored pigment or blue colored dye is formed on the second transparent substrate 210 having the red and green pixels 'R' and 'G' formed thereon, and then the photoresist is patterned to form the blue pixel 'B' of the color filter 224. This concludes formation of the color filter layer 220 including the black matrix 222 and the color filter 224.

The red, green and blue pixels 'R', 'G' and 'B' of the color filter 224 are spaced apart from each other, and the black matrix 222 is disposed between the two of the red, green and blue pixel 'R', 'G' and 'B'.

Figure 8C:
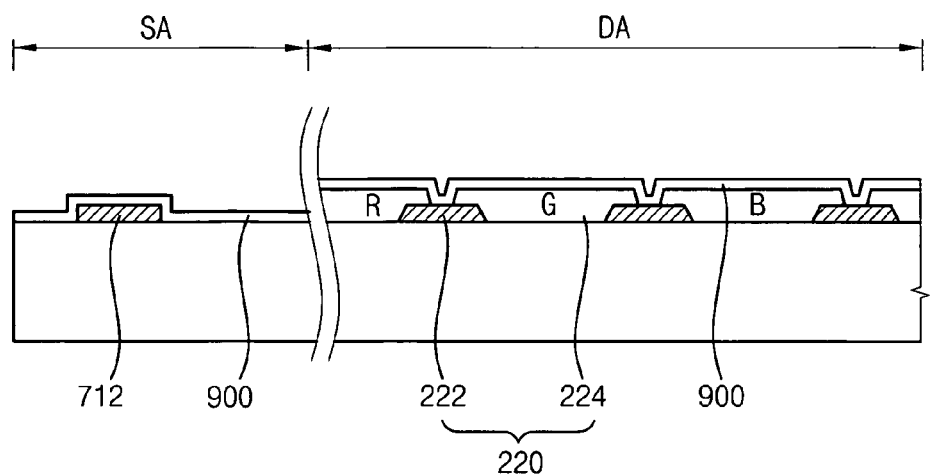

Referring to FIG. 8C, a transparent layer 900 including, for example ITO is formed on the color filter layer 220 having the black matrix 222 and the color filter 224. The transparent layer 900 covers both the display region DA and the peripheral region SA. Alternatively, the transparent layer 900 may be formed to cover only the display region DA. When the transparent layer 900 is formed to cover only the display region, the second metal layer pattern 712 corresponds to the second alignment key 710.

Figure 8D:
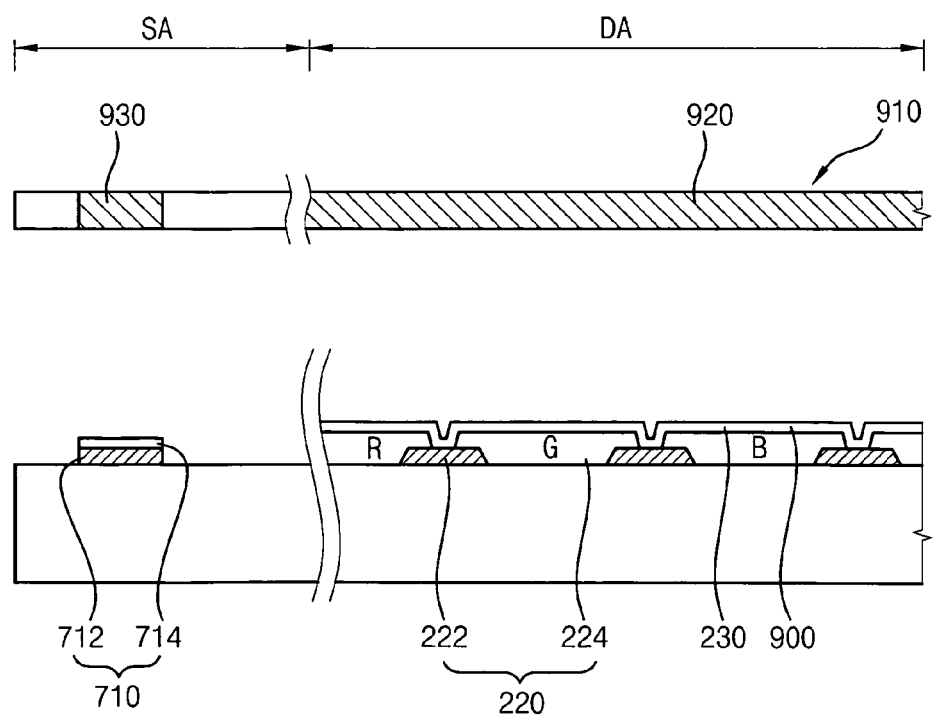

Referring to FIG. 8D, a third mask 910 having patterns is disposed over the transparent layer 900. The third mask 910 includes a third blocking portion 920 for forming the common electrode 230, and a fourth blocking portion 930 for forming the second alignment key 710.

Then, the transparent layer 900 is exposed and developed to form the common electrode 230 and the second alignment key 710. When the transparent layer 900 is etched, the second metal layer pattern 712 including chromium (Cr) may also be etched to form the second alignment key 710. When the transparent layer 900 for forming the common electrode 230 is formed only on the display region DA but not on the peripheral region SA, a process step corresponding to FIG. 8D is not required.

According to an exemplary embodiment, the color filter substrate 200 includes no over-coating layer. However, it is contemplated that the method may also be applied to a color filter substrate including such an over-coating layer.

For Example, the over-coating layer of the peripheral region SA of the color filter substrate may be removed through a process of removing photoresist disposed at edge portions of the color filter substrate. Therefore, only the second metal layer pattern for forming the black matrix and the second transparent layer for forming the common electrode are disposed at the peripheral region SA of the color filter substrate, where the second alignment key is disposed, so that same procedure may be applied.

According to an exemplary embodiment of the present invention, a display device includes a first substrate, a second substrate, a first alignment key and a second alignment key. The first substrate has a first display region and a first peripheral region surrounding the first display region. The second substrate faces the first substrate. The second substrate has a second display region facing the first display region and a second peripheral region facing the first peripheral region. The first alignment key is disposed in the first peripheral region of the first substrate. The first alignment key includes a first layer that is opaque and a second layer that is transparent. The second alignment key is disposed in the second peripheral region of the second substrate such that the second alignment key faces the first alignment key.

As a result, first alignment key may be formed through a procedure of forming the pixel electrode. Therefore, there exists no deviation between the first alignment key and the pixel electrode and the first alignment key may be easily detected because of the first metal layer pattern that is opaque, so that misalignment is prevented.

Having described the exemplary embodiments of the present invention and its advantages, it is noted that various changes, substitutions and alterations can be made herein without departing from the spirit and scope of the invention as defined by appended claims. Moreover, the use of the terms first, second, etc. do not denote any order or importance, but rather terms first, second etc. are used to distinguish one element from another. Furthermore, the use of the terms a, an, etc. do not denote a limitation of quantity, but rather denote the presence of at least one of the referenced item.

What is claimed is:

1. A display device comprising:
    a first substrate having a first display region and a first peripheral region;
    a second substrate facing the first substrate, the second substrate having a second display region facing the first display region and a second peripheral region facing the first peripheral region;
    a plurality of first alignment keys disposed in the first peripheral region of the first substrate, each of the first alignment keys including a first pattern and a second pattern, the second pattern being disposed on the first pattern; and
    a plurality of second alignment keys disposed in the second peripheral region of the second substrate such that each of the second alignment keys faces a first alignment key,
    wherein the first substrate comprises a switching element having a gate electrode, a drain electrode and a source electrode, the gate electrode including a same material as the first pattern.

2. The display device of claim 1, wherein the second pattern is transparent.

3. The display device of claim 1, wherein the first substrate comprises a transparent electrode electrically connected to the drain electrode.

4. The display device of claim 3, wherein the transparent electrode in the first substrate includes a same material as the second pattern.

5. The display device of claim 1, wherein the first pattern and the second pattern have a same shape.

6. The display device of claim 1, wherein the first pattern is made of material including chromium (Cr).

7. The display device of claim 6, wherein the second pattern is made of material including indium tin oxide (ITO) or indium zinc oxide (IZO).

8. A display device comprising:
    a first substrate having a first display region and a first peripheral region;
    a second substrate facing the first substrate, the second substrate having a second display region facing the first display region and a second peripheral region facing the first peripheral region;
    a plurality of first alignment keys disposed in the first peripheral region of the first substrate, each of the first alignment keys including a first pattern and a second pattern, the second pattern being disposed on the first pattern; and
    a plurality of second alignment keys disposed in the second peripheral region of the second substrate such that each of the second alignment keys faces a first alignment key,
    wherein the first substrate comprises a switching element having a gate electrode, a drain electrode and a source electrode, the source electrode including a same material as the first pattern.

9. The display device of claim 8, wherein the first substrate comprises a transparent electrode electrically connected to the drain electrode and including a same material as the second pattern.

10. The display device of claim 1, wherein the second alignment key includes a third pattern that is opaque and a fourth pattern that is transparent.

11. The display device of claim 10, wherein the second substrate comprises a color filter layer including color filters and a black matrix disposed between the color filters.

12. The display device of claim 11, wherein the black matrix includes a same material as the third pattern.

13. The display device of claim 11, wherein the second substrate comprises a transparent common electrode including a same material as the fourth pattern.

14. The display device of claim 1, wherein the first alignment key substantially surrounds the second alignment key.

15. The display device of claim 14, wherein the first alignment key has a frame shape having an opening and the second alignment key has a same shape as the opening.

16. The display device of claim 4, wherein the first pattern and the second pattern have a same shape.

17. The display device of claim 16, wherein the first alignment key substantially surrounds the second alignment key.

18. The display device of claim 8, wherein the first alignment key substantially surrounds the second alignment key.

19. The display device of claim 9, wherein the first pattern and the second pattern have a same shape.

20. The display device of claim 19, wherein the first alignment key substantially surrounds the second alignment key.

21. The display device of claim 10, wherein the first substrate comprises a transparent electrode electrically connected to the drain electrode and including a same material as the second pattern.

22. The display device of claim 13, wherein the first substrate comprises a transparent electrode electrically connected to the drain electrode and including a same material as the second pattern.

* * * * *

UNITED STATES PATENT AND TRADEMARK OFFICE
CERTIFICATE OF CORRECTION

PATENT NO. : 7,629,613 B2 Page 1 of 1
APPLICATION NO. : 11/223338
DATED : December 8, 2009
INVENTOR(S) : Sohn et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 263 days.

Signed and Sealed this

Twenty-first Day of December, 2010

David J. Kappos
*Director of the United States Patent and Trademark Office*